United States Patent [19]
Kitazawa et al.

[11] Patent Number: 5,952,709
[45] Date of Patent: Sep. 14, 1999

[54] HIGH-FREQUENCY SEMICONDUCTOR DEVICE AND MOUNTED STRUCTURE THEREOF

[75] Inventors: Kenji Kitazawa; Shinichi Koriyama; Mikio Fujii, all of Kokubu, Japan

[73] Assignee: Kyocera Corporation, Kyoto, Japan

[21] Appl. No.: 08/884,223

[22] Filed: Jun. 27, 1997

[30] Foreign Application Priority Data

| Dec. 28, 1995 | [JP] | Japan | 7-342296 |
| Apr. 26, 1996 | [JP] | Japan | 8-107139 |
| Jun. 28, 1996 | [JP] | Japan | 8-169534 |
| Aug. 30, 1996 | [JP] | Japan | 8-229922 |
| Nov. 12, 1996 | [JP] | Japan | 8-300129 |
| Nov. 29, 1996 | [JP] | Japan | 8-320491 |

[51] Int. Cl.$^6$ .................. H01L 23/528
[52] U.S. Cl. ............... 257/664; 257/275; 257/758
[58] Field of Search .................. 257/275, 664, 257/758

[56] References Cited

U.S. PATENT DOCUMENTS

| 4,259,684 | 3/1981 | Dean et al. | 257/704 |
| 4,875,087 | 10/1989 | Miyauchi et al. | 257/664 |
| 5,387,888 | 2/1995 | Eda et al. | 257/664 |
| 5,426,319 | 6/1995 | Notani | 257/275 |
| 5,596,171 | 1/1997 | Harris et al. | 257/664 |

*Primary Examiner*—David B. Hardy
*Attorney, Agent, or Firm*—Loeb & Loeb LLP

[57] ABSTRACT

A high-frequency semiconductor device contains a semiconductor element in a cavity formed by a dielectric board and a cap. A first high-frequency transmission line connected to the semiconductor element is formed on the surface of said dielectric board in said cavity and a second high-frequency transmission line is formed on the bottom surface of said dielectric board, so that said first high-frequency transmission line and said second high-frequency transmission line are electromagnetically coupled together. In this semiconductor devise in which the first transmission line and the second transmission line are electromagnetically coupled together, the transmission lines need not be passed over the side wall of the cap, and neigther reflection loss or radiation loss takes place on the side wall. Besides, transmission loss of high-frequency signals is caused by neigther throughholes or via-holes, and is effectively suppressed.

16 Claims, 11 Drawing Sheets

F I G. 16
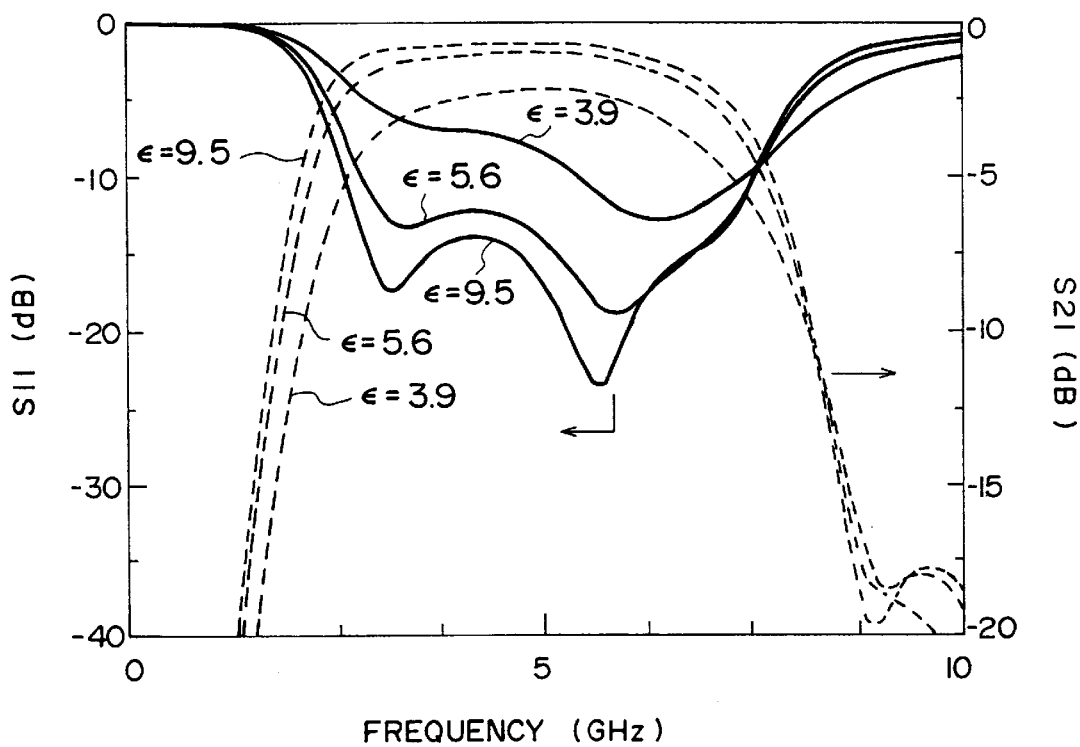

F I G. 17
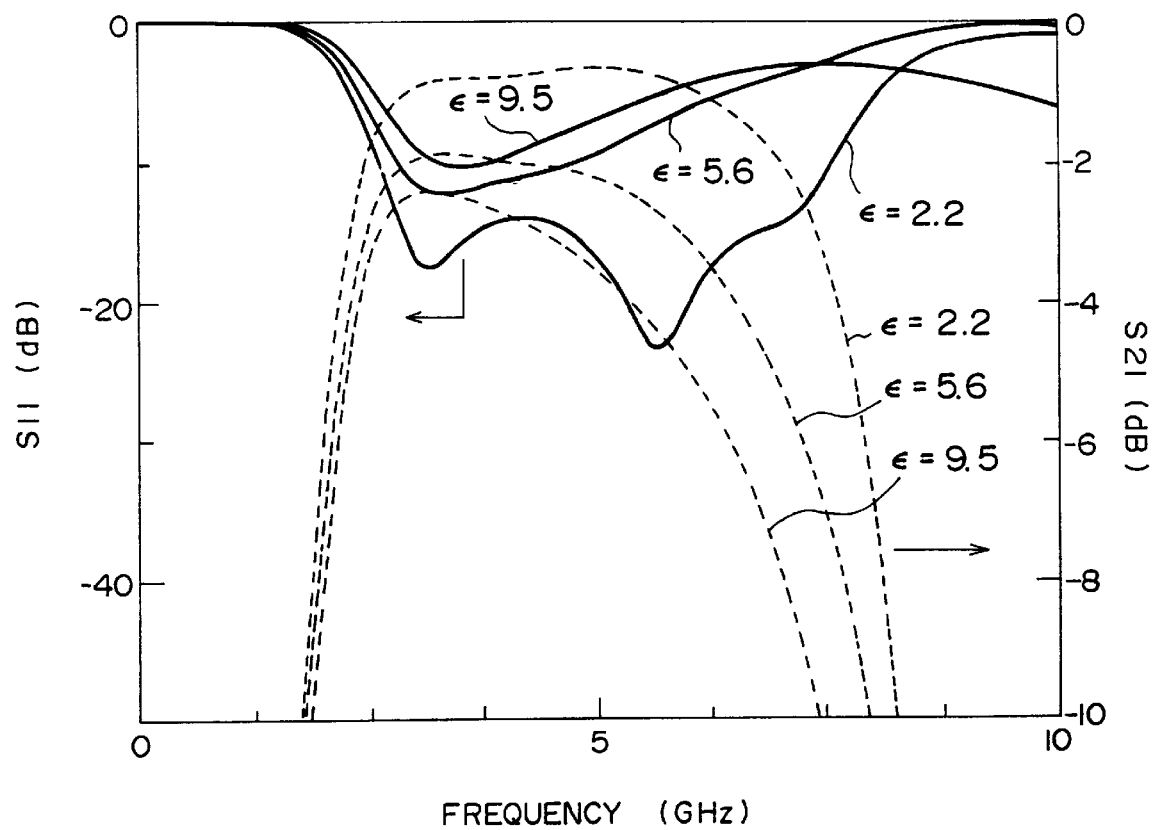

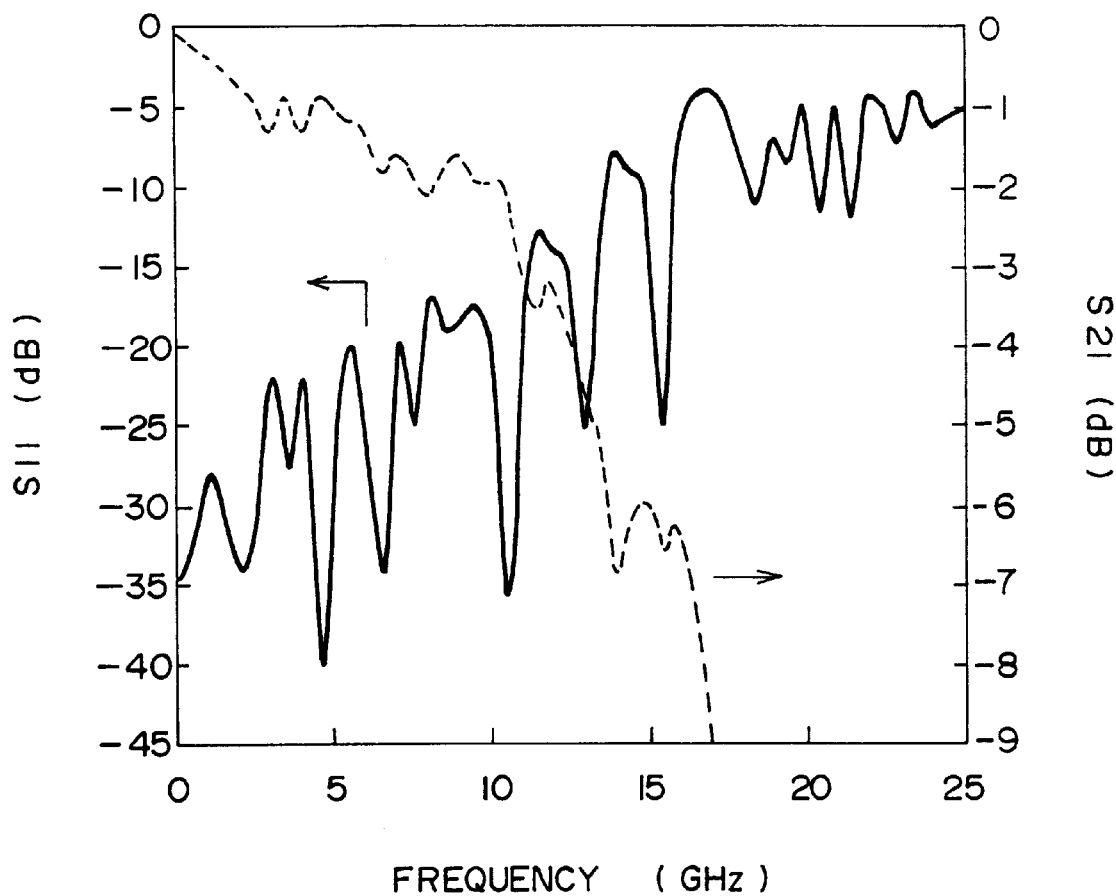
F I G . 20

HIGH-FREQUENCY SEMICONDUCTOR DEVICE AND MOUNTED STRUCTURE THEREOF

BACKGROUND OF THE INVENTION

1. Field of the Invention

The present invention relates to a semiconductor device used in high frequencies ranging from microwave band to millimeter wave band and, particularly, to a semiconductor device capable of transmitting signals to the semiconductor elements and circuit components without deteriorating the characteristics of high-frequency signals. The invention further relates to a mounted structure in which a high-frequency semiconductor device is mounted on a mother board minimizing the degradation of the characteristics of high-frequency signals.

2. Description of the Prior Art

There have heretofore been known high-frequency semiconductor devices for handling microwave and millimetric wave signals having structures as shown, for example, in FIGS. 18 and 19. In these semiconductor devices, a semiconductor element 73 for high-frequency use is mounted in a cavity 72 formed by a cap 71 and an insulating board 70 made of a dielectric material, the cavity 72 being air-tightly sealed. In the semiconductor device of FIG. 18, a signal transmission line 74 such as strip line is electrically connected to the semiconductor element 73 by bonding a wire or using a ribbon, drawn out of the cavity 72 passing through a wall member 75, and is extended up to the bottom surface of the semiconductor device passing over the side surface of the board 70 (Japanese Laid-Open Patent Publication No. 168939/1986). Referring to FIG. 19, furthermore, a signal transmission line 78 is formed on the bottom surface of the insulating board 70 and is connected to the semiconductor element 73 via a through-hole 79.

That is, in these semiconductor devices, high-frequency signals are usually input and output through a transmission line 74 or 78 arranged on the bottom surface of the insulating board 70. Besides, the semiconductor device is mounted on a mother board by connecting the transmission line 74 or 78 to a wiring layer 77 of the mother board 76 by soldering or the like method.

In the semiconductor device of FIG. 18, however, the width of the signal line must be narrowed at a portion where the transmission line 74 passes through the wall member 75. This is to change the signal line from a microstrip line into a strip line. As a result, reflection loss and radiation loss easily occur in this passage portion causing characteristics of the transmitted high-frequency signals to be deteriorated. Moreover, since the transmission line 74 is folded by the side surface of the substrate 70, high-frequency signals of millimeter wave band are mostly reflected by the folded transmission line 74 and are scarcely received. Besides, since a transmission line is formed on the side surface of the board mounting the semiconductor element, the semiconductor device itself inevitably becomes bulky making it difficult to realize a circuit board mounting the semiconductor device in a small size.

In the semiconductor device shown in FIG. 19, on the other hand, the transmission line 78 is connected to the semiconductor element 73 via the through-hole 79. Therefore, the transmission line neither passes through the wall member nor is folded, and characteristics of the signals are less deteriorated. As the frequency of the transmitted signals becomes higher than 10 GHz, however, the transmission loss in the through-hole 79 sharply increases, making it difficult to transmit the microwave to millimetric wave signals without deteriorating their characteristics.

SUMMARY OF THE INVENTION

Therefore, the object of the present invention is to provide a semiconductor device for high-frequency use, which is capable of transmitting high-frequency signals of microwave band to millimetric wave band to the semiconductor elements and circuit members without deteriorating their characteristics, as well as to provide a mounted structure thereof.

According to the present invention, there is provided a high-frequency semiconductor device containing a semiconductor element in a cavity formed by a dielectric board and a cap, comprising a first high-frequency transmission line formed on a surface of said dielectric board in said cavity and connected to said semiconductor element, and a second high-frequency transmission line formed on a bottom surface of said dielectric board, said first high-frequency transmission line and said second high-frequency transmission line being electromagnetically coupled together.

According to the present invention, furthermore, there is provided a high-frequency semiconductor device-mounted structure in which the second high-frequency transmission line in the high-frequency semiconductor device is directly connected by soldering to a wiring layer formed on a surface of a mother board.

According to the present invention, there is further provided a high-frequency semiconductor device-mounted structure in which a semiconductor device containing a semiconductor element in a cavity formed by a dielectric board and a cap, is mounted on a mother board, wherein a first high-frequency transmission line connected to said semiconductor element is formed on the surface of said dielectric board in said cavity of said semiconductor device, a second high-frequency transmission line is formed on a surface of said mother board, and said first high-frequency transmission line and said second high-frequency transmission line are electromagnetically coupled together.

In the present invention, an important feature resides in that the first high-frequency transmission line electrically connected to a semiconductor element such as IC element is electromagnetically coupled to the second high-frequency transmission line formed on the bottom surface of the dielectric board of the semiconductor device or on the surface of the mother board. Upon employing such an electromagnetic coupling, the transmission lines can be coupled together without passing through the side wall of the cap, and no reflection loss or radiation loss occurs on the side wall. Moreover, there occurs no effect of transmission loss caused by through-holes or via-holes, making it possible to suppress the transmission loss of high-frequency signals and to effectively transmit signals of desired frequencies.

The present invention is further advantageous in realizing the semiconductor device in a small size.

BRIEF DESCRIPTION OF THE DRAWINGS

FIG. 16 is a diagram illustrating transmission characteristics of the input portion of a semiconductor device prepared in Example 3 as measured by using a network analyzer;

FIG. 17 is a diagram illustrating transmission characteristics of the input portion of a semiconductor device prepared in Example 4 as measured by using the network analyzer;

FIG. 20 is a diagram illustrating transmission characteristics of the input portion of the semiconductor device of FIG. 19 as measured by using the network analyzer (Comparative Example 1).

DETAILED DESCRIPTION OF THE INVENTION

Figure 1:
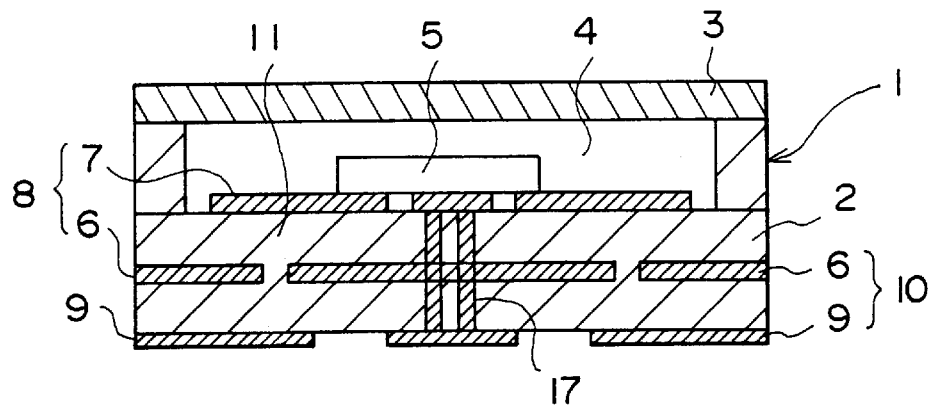
FIG. 1 is a side sectional view of a high-frequency semiconductor device of the present invention.

Referring to FIG. 1, illustrating a high-frequency semiconductor device of the present invention, the high-frequency semiconductor device designated as 1 has a dielectric board 2 made of a dielectric material and a cap 3. A cavity 4 is formed by the board 2 and the cap 3, and a semiconductor element 5 such as IC is mounted in the cavity 4.

The cap 3 is made of a material such as ceramics, ceramic-metal composite material or glass ceramic, that is capable of preventing electromagnetic waves from leaking out of the cavity 4. It is, of course, allowable to disperse electromagnetic wave-absorbing substances such as carbon and the like in these materials or to apply electromagnetic wave-absorbing substances on the surface of the cap 3.

The semiconductor element 5 is connected to a signal transmission line for transmitting signals. In the present invention, the signal transmission line comprises a first high-frequency transmission line 8 formed on the front surface side 2 of the dielectric board and a second high-frequency transmission line 10 formed on the bottom side of the board 2. These transmission lines are selected from a microstrip line (MS line), a strip line or a conductor-backed copolanar waveguide. In the embodiment of FIG. 1, the MS line is employed. That is, the first MS line 8 is constituted by a ground layer 6 which is a conducting layer formed on nearly the whole of the dielectric board 2 and a strip conductor 7 formed on the surface of the board 2, the strip conductor 7 being connected to the semiconductor element 5. The second MS line 10 is constituted by the ground layer 6 and a strip conductor 9 formed on the bottom surface of the dielectric board 2.

The ground layer 6 has slots 11 without conductor layer. The end of the strip conductor 7 of the first MS line 8 is opposed to the end of the strip conductor 9 of the second MS line 10 in a manner that the slot 11 is sandwiched therebetween. Due to this structure, the strip conductors 7 and 9 are electromagnetically coupled together to transmit signals without loss. The slots 11 may be formed in a plural number.

Figure 2:
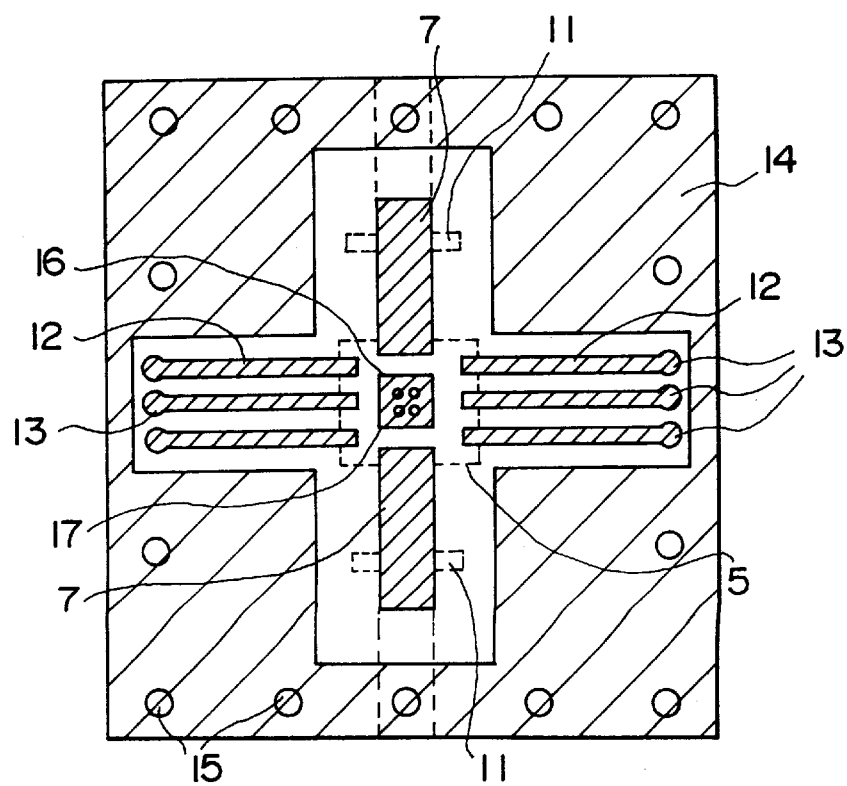
FIG. 2 is a diagram illustrating a wiring structure in a cavity in the semiconductor device of FIG. 1.

Referring to FIG. 2 illustrating the wiring structure in the cavity in the semiconductor device of FIG. 1, inside the cavity 4 are formed a power source layer 12 for supplying electric power to the semiconductor element 5, together with a semiconductor element 5 and a strip conductor 7 forming the first MS line 8. The ends on one side of the strip conductor 7 and of the power source layer 12 are electrically connected to the semiconductor element 5, respectively. The other end of the strip conductor 7 extends up to a portion on the slot 11 formed in the ground layer 6. The other end of the power source layer 12 is conducting to the bottom surface of the dielectric board 2 via a through-hole 13.

The semiconductor element 5 can be connected to strip conductor 7 or power source layer 12 by soldering or gold bumps without transmission loss. The connection method, however, is in no way limited thereto only. For example, the connection can be accomplished by using gold ribbons or bonding the wires, or by using a conductor plate obtained by forming a conductor layer such as of copper on a polyimide board.

In order to prevent the electromagnetic waves from leaking, a ground layer 14 is provided around the strip conductor 7, power source layer 12 and semiconductor element 5 in the cavity. Many through-holes 15 are formed in the ground layer 14 to suppress dispersion in the potential and to prevent the electromagnetic waves from leaking.

A ground surface 16 composed of a conductor is formed on the surface of the board 2 under the semiconductor element 5, and a thermal via 17 penetrating through the board 2 (see FIG. 1) is connected to the ground surface 16, so that heat generated by the semiconductor element 5 is radiated to the lower surface of the semiconductor device 1.

Figure 3:
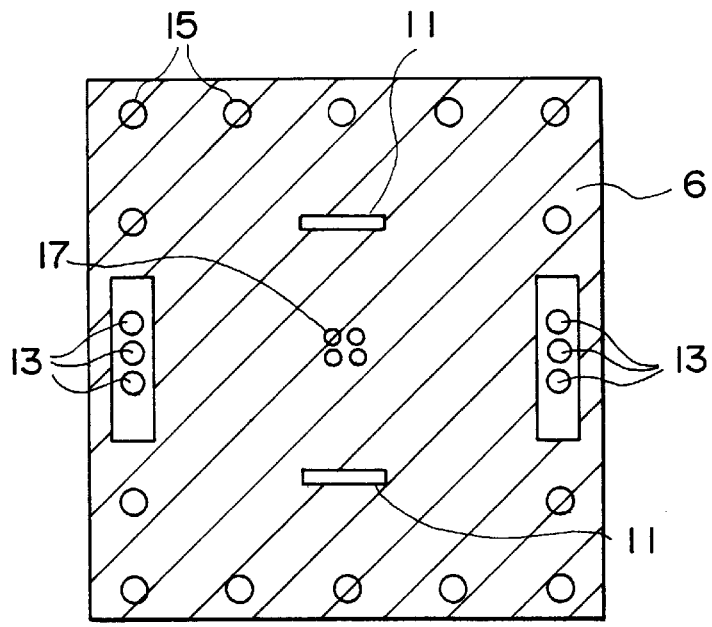
FIG. 3 is a diagram illustrating a wiring structure of a ground layer formed in the dielectric board of the semiconductor device of FIG. 1.

Referring to FIG. 3 which illustrates the wiring structure of the ground layer 6, slots 11 are formed in the ground layer 6 at positions opposed to the ends of the strip conductors 7 and 9. Furthermore, through-holes 13 extending from the power source layers 12 are extending penetrating through the ground layer 6 so will not to come into electric contact. Moreover, through-holes 15 extending from a ground layer 14 on the upper surface are passing through the edge portions of the ground layer 6, and the ground layer 6 and the ground layer 14 are electrically connected together. The thermal via 17 extending from the lower side of the semiconductor element 5 is passing through the central portion of the ground layer 16.

Figure 4:
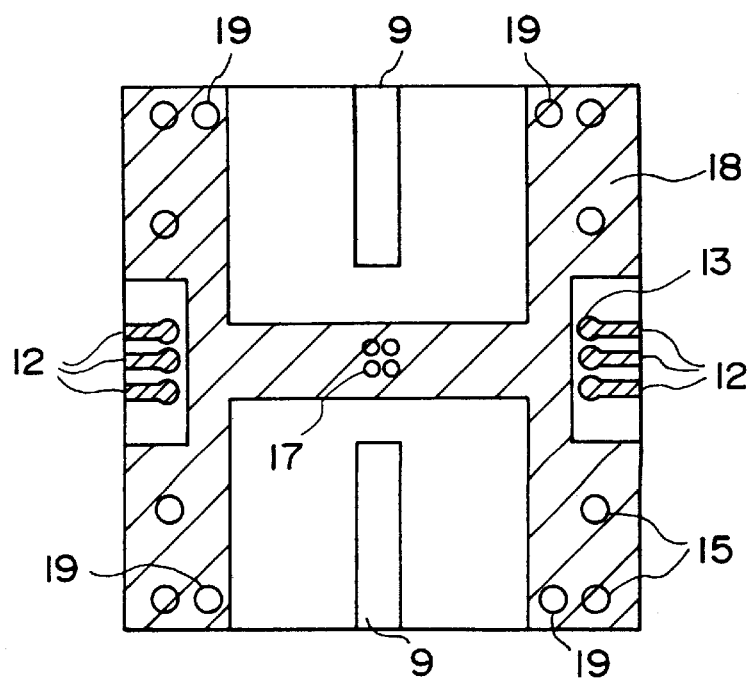
FIG. 4 is a diagram illustrating a wiring structure on the bottom surface of the semiconductor device 1.

Referring to FIG. 4 illustrating the wiring structure on the bottom surface of the semiconductor device 1, on this bottom surface is formed a strip conductor 9 of which the end is opposed to the slot 11, and through-holes 13 are extending from the power source layers 12 on the upper surface so as to be electrically conductive to the bottom surfaces of the power source layers 12. A ground layer 18 is formed on the bottom surface, and the thermal via 17 extending from the lower side of the semiconductor element 5 is connected to the ground layer 18. The ground layer 18 is not electrically contacted to the through-holes 13 and are not conductive to the power source layers 12. Via the through-holes 15, however, the ground layer 18 is conductive to the ground layers 6 and 14. Moreover, terminals 19 are formed on the ground layer 18 to make a connection to the mother board.

In the semiconductor device of a structure shown in FIGS. 1 to 4, the first MS line 8 and the second MS line 10 are electromagnetically coupled together. According to the present invention, high-frequency signals are effectively transmitted without deteriorating characteristics owing to the electromagnetic coupling. The electromagnetic coupling structure will now be described in detail with reference to FIGS. 5 to 8.

Figure 5:
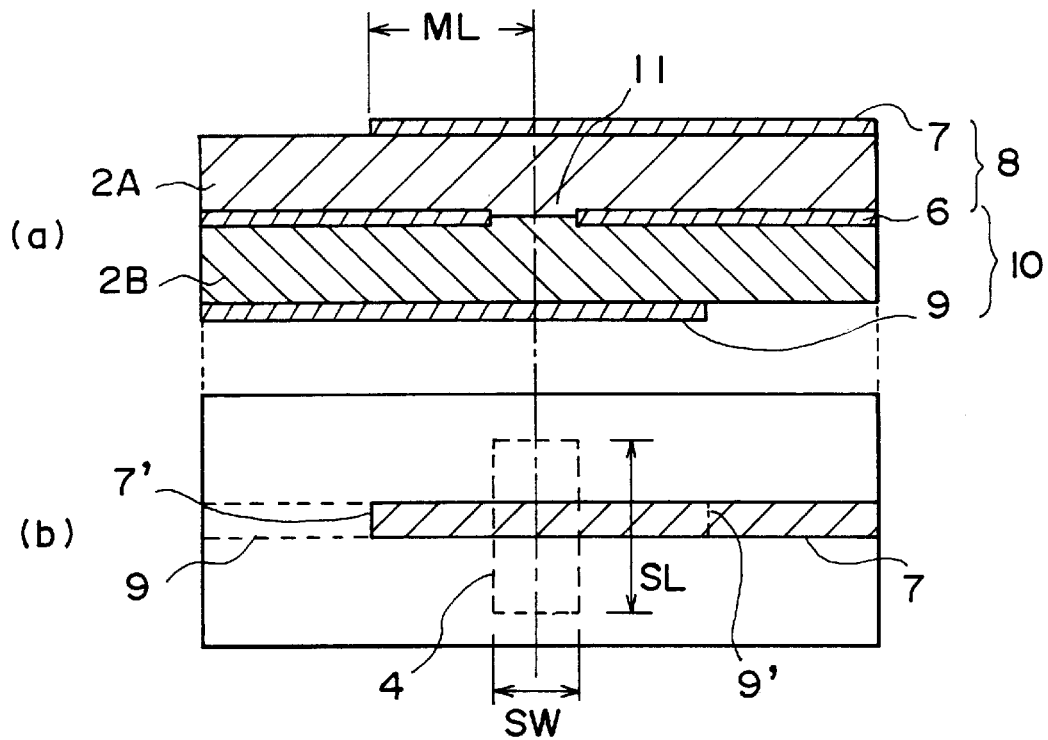
FIG. 5 is a diagram illustrating a basic structure of electromagnetic coupling employed by the semiconductor device of FIG. 1.
Figure 6:
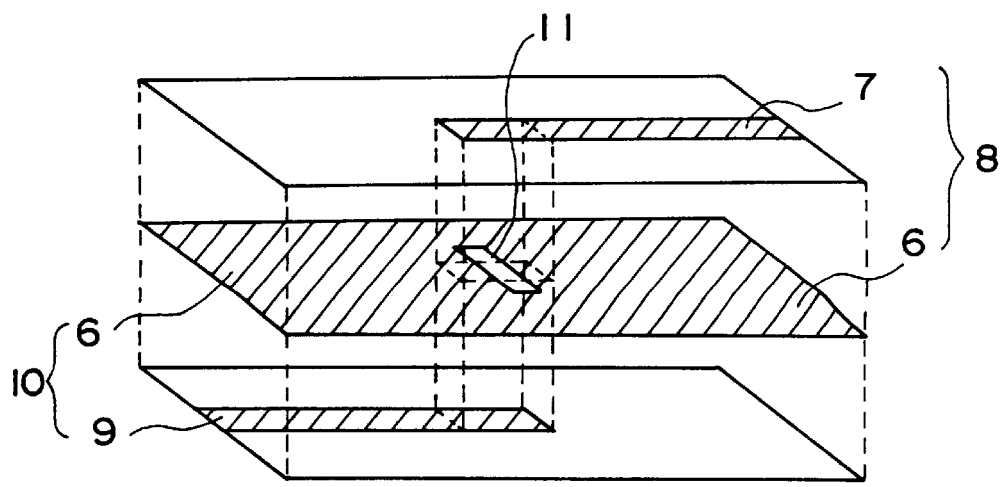
FIG. 6 is a perspective view of the electromagnetic coupling of FIG. 5.

Referring to FIG. 5 for explaining the basic structure of electromagnetic coupling employed in the present invention, the diagram (a) is a side sectional view of the dielectric board 2 of the semiconductor device of FIG. 1 on an enlarged scale, and the diagram (b) is a top view of the dielectric board 2. In FIG. 5, the dielectric board 2 of the side higher than the ground layer 6 is denoted by 2A and the dielectric board 2 of the side lower than the ground layer 6 is denoted by 2B. FIG. 6 is a perspective view of the electromagnetic coupling shown in FIG. 5. As will be understood from FIGS. 5 and 6, the strip conductor 7 is formed on the upper surface of the dielectric layer 2A, the strip conductor 9 is formed on the lower surface of the dielectric layer 2B, the first MS line 8 is constituted by the interaction of the strip conductor 7 and the ground layer 6, and the second MS line 10 is constituted by the interaction of the strip conductor 9 and the ground layer 6.

The strip conductors 7 and 9 are so arranged that their ends are symmetrical to each other relative to the slot 11 formed in the ground layer 6, whereby the MS lines 8 and 10 formed in the different layers (dielectric layer 2A, dielectric layer 2B) are electromagnetically coupled together. In FIG. 5, the distance from a portion just on the center of the slot 11 to the end 7' of the strip conductor 7 is denoted by ML (mm) (same as the distance to the end 9' of the strip conductor 9), the length of the slot 11 in the lengthwise direction is denoted by SL (mm) and the width of the slot 11 is denoted by SW (mm).

In FIGS. 5 and 6, when high-frequency signals are fed to the first MS line 8, a traveling wave heading toward the end 7' of the strip conductor 7 overlaps the retrogressing wave reflected at the end 7'. By adjusting the distance ML from a portion just on the center of the slot 11 to the end 7' of the strip conductor 7, therefore, it is allowed to increase the current just on the slot 11. The distance ML for increasing the current just on the slot 11 varies depending upon the frequency of the transmitted signals and the dielectric constant ε of the dielectric layer 2A constituting the MS line 8.

An increase in the current just on the slot 11 results in an increase in the intensity of the magnetic field at this place, and a magnetic field is generated accompanied by an intense magnetic field encircling the strip conductor 7 of the MS line 8. Upon adjusting the length SL of the slot 11, therefore, an intense electromagnetic field is excited in the slot 11 due to the magnetic field generated by the MS line 8. Then, an electromagnetic field is generated even by the MS line 10 of the lower surface accompanied by an intense magnetic field which encircles the strip conductor 9, and high-frequency signals fed to the MS lines 8 are transmitted to the MS line 10 through the slot 11.

The magnetic field of high-frequency signals transmitted over the transmission line assumes an encircling form on a plane perpendicular to the MS line at all times unlike that of the case of when a via hole conductor is used, and migrates from the MS line 8 to the MS line 10 through the slot 11 in an electromagnetically coupled manner. According to the present invention, therefore, the high-frequency signals can be transmitted with a small loss.

The above-mentioned electromagnetic coupling is the most basic form. In the thus coupled state, it has been reported that the distance ML is set to be ¼ the signal wavelength, and the length SL is set to be ½ the signal wavelength. However, the present inventors have discovered the fact that when signals of millimetric waves of higher than 30 GHz are transmitted, the MS line becomes capacitive, the slot becomes inductive, and the transmitted signals as a whole resonate and are coupled together provided the sizes of the portions constituting the electromagnetic coupling portion satisfy a predetermined relationship. That is, according to the present invention in which the sizes of the portions constituting the electromagnetic coupling portion satisfy a predetermined relationship, the transmission characteristics of the electromagnetic coupling portion change little and the transmission lines are coupled together (MS lines 8 and 10 are coupled together) with a small loss even when the sizes of the portions vary to some extent due to tolerance during the production.

Concretely speaking, when the frequency of high-frequency signals being transmitted is denoted by f (GHz) and the dielectric constant of the dielectric layers 2A and 2B are denoted by ε, it is desired that the above-mentioned length ML (mm), length SL (mm) and width SW (mm) satisfy the following formulas (i) to (iv);

$$\frac{21.6}{f \cdot \varepsilon^{1/2}} \le ML \le \frac{151}{f \cdot \varepsilon^{1/2}} \qquad \text{(i)}$$

$$\frac{50.1}{f \cdot \varepsilon^{1/2}} \le SL \le \frac{284}{f \cdot \varepsilon^{1/2}} \qquad \text{(ii)}$$

$$2.04 \cdot ML - \frac{91.0}{f \cdot \varepsilon^{1/2}} \le SL \le 2.07/ML + \frac{106}{f \cdot \varepsilon^{1/2}} \qquad \text{(iii)}$$

$$0.05 \le SW \le 0.4 \qquad \text{(iv)}$$

That is, the transmission line coupling with the smallest loss is established when the relations of the above-mentioned formulas (i) to (iv) are all satisfied. For example, as will be demonstrated by an embodiment described later, the coupling with an insertion loss of smaller than −4 dB is established by the signals of frequencies of 30 to 60 GHz when the relations of the above-mentioned formulas (i) to (iv) are satisfied.

Figure 7:
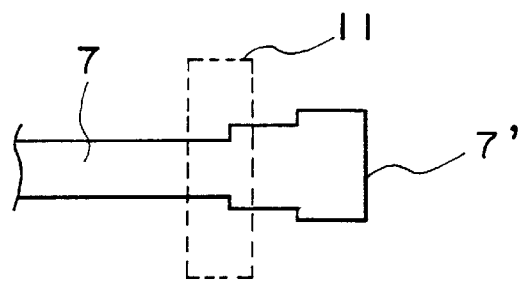
FIG. 7 is a diagram illustrating another structure of electromagnetic coupling used in the present invention.
Figure 8:
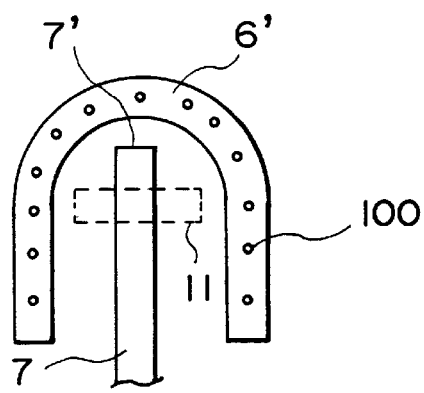
FIG. 8 is a diagram illustrating a further structure of electromagnetic coupling used in the present invention.

The structure of the electromagnetic coupling used in the present invention is in no limited to the one shown in FIGS. 5 and 6 but may be, for example, the ones shown in FIGS. 7 and 8. That is, in FIG. 7, the end 7' (9') of the strip conductor 7 (9) gradually spreads from a position where the slot 11 is formed toward the end. This shape makes it possible to decrease the reflection of high-frequency signals at the end 7' (9') of the conductor 7 (9). In FIG. 8, an arch-like ground layer 6' is formed to surround the end 7' (9') of the strip conductor 7 (9). A plurality of through-holes 100 are formed in the ground layer 6' which, therefore, is electrically connected to the ground layer 6 in the dielectric board 2 via the through-holes 100. By forming such a ground layer 6', it is allowed to further improve characteristics of high-frequency signals at the ends 7', 9' of the conductors 7 and 9 to thereby effectively prevent the leakage of high-frequency signals near these ends and the slots 11. In FIG. 8, it is desired that the gaps among the through-holes 100 are set to be not larger than ¼ the signal wavelength. The widths of the strip conductors 7, 9 and the thicknesses of the dielectric layers 2A, 2B are so determined that the characteristic impedances of the lines will assume desired values. Thicknesses of the dielectric layers 2A, 2B should be so selected as will not generate a surface wave mode.

In the present invention, the transmission characteristics of the electromagnetic coupling structure between the MS lines 8 and 10 are improved with a decrease in the resistances of the conductors that constitute conductor lines and ground layers, and the transmission loss decreases. As the conductor, therefore, there can be used W, Mo, Mo—Mn alloy, Cu, Au, Ag, Al, Pt, etc. Among them, it is desired to use Cu, Au, Ag or Al having a small electric resistance.

As the dielectric material constituting the dielectric substrate 2, there can be used any inorganic or organic dielectric that has heretofore been used in the wiring board or as the insulating board for the packages. In order to form a laminated layer structure of dielectric board, conductor lines and ground layer as shown in FIGS. 1 to 5, it is desired that the conductors and the dielectrics are so selected that they can be simultaneously fired together. Examples of the combination of the conductors and the dielectrics are as described below.

| Conductors | Dielectrics |
| --- | --- |
| High-melting metals such as W, Mo, etc. | Ceramics such as Al$_2$O$_3$, AlN and Si$_3$N$_4$ |
| Cu, Au, Ag | Ceramics that can be fired at 900 to 1100° C., such as borosilicate glass; crystalline glass capable of precipitating crystalline phase in a sintering step; amorphous glass; glass-ceramic sintered product obtained by adding, as a filler, alumina, zirconia, cordierite, forsterite, or silica to the above glasses, followed by firing; ceramics obtained by adding boron oxide or alkali metal oxide as a sintering assistant to the dielectric such as magnesium titanate or calcium titanate followed by firing (dielectrics are fired simultaneously with the conductor). |

In the present invention, the semiconductor device of the structure shown in FIG. 1 is fabricated by using the above-mentioned conducting materials and dielectric materials; i.e., by printing a paste containing various conductor metals in a predetermined pattern on the surface of a green sheet obtained by molding a powder of a dielectric material, and laminating pattern-printed green sheets one upon the other, followed by firing at a desired temperature.

In order to transmit signals between the semiconductor device and the mother board permitting a small transmission loss according to the present invention, it is desired that the dielectric material constituting the dielectric board 2 has a dielectric constant of not smaller than 7. That is, in the semiconductor device of the present invention, it is desired to increase the electromagnetic coupling between the transmission lines (between the MS lines 8 and 10) in order to concentrate the electromagnetic field generated in the electromagnetic coupling portion. For this purpose, it is desired that the dielectric substrate 2 has a higher dielectric constant. For instance, when the dielectric constant of the dielectric substrate 2 is smaller than 7, the electromagnetic field spreads in the electromagnetic coupling portion, the electromagnetic coupling becomes loose, and the transmission characteristics are deteriorated.

Figure 9:
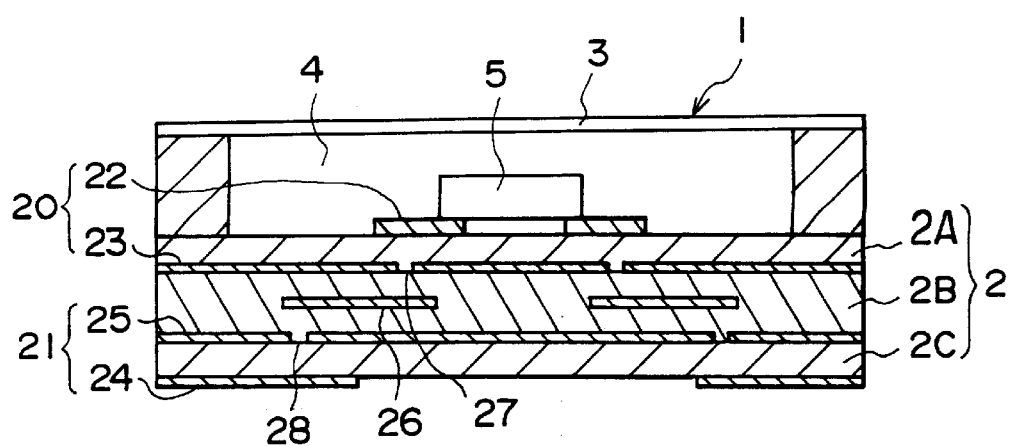
FIG. 9 is a sectional view schematically illustrating a semiconductor device of the present invention which is provided with a filter circuit.

The high-frequency semiconductor device of the present invention may be provided with a filter circuit so that the electromagnetic coupling portion permits the passage of high-frequency signals of a particular frequency only. FIG. 9 illustrates a semiconductor device provided with such a filter circuit.

In FIG. 9 which is a schematic sectional view of the semiconductor device, a first MS line 20 is formed on the front surface side of the dielectric board 2 in the cavity 4, and a second MS line 21 is formed on the bottom surface side of the dielectric board 2. The first MS line 20 is constituted by a strip conductor 22 formed on the surface of the dielectric board 2 in the cavity 4 and a ground layer 23 provided inside the dielectric board 2, and the second MS line 21 is constituted by a strip conductor 24 formed on the bottom surface of the dielectric board 2 and a ground layer 25 formed inside the dielectric board 2. That is, in the embodiments of FIGS. 1 to 8, the first and second MS lines share the ground layer but in the embodiment of FIG. 9, the ground layers are separately formed to constitute the MS lines.

In the semiconductor device of FIG. 9, a filter circuit 26 is formed between the ground layer 23 and the ground layer 25. An end of the strip conductor 22 and an end of the filter circuit 26 are opposed to each other with a slot 27 formed in the ground layer 23 sandwiched therebetween. It will therefore be understood that the first MS line 20 and the filter circuit 26 are electromagnetically coupled together. On the other hand, an end of the strip conductor 24 and the other end of the filter circuit 26 are opposed to each other with a slot 28 formed in the ground layer 25 sandwiched therebetween. Therefore, the second MS line 21 and the filter circuit 26 are electromagnetically coupled together, too. In this embodiment, it is desired that the end of the strip conductor 22 and the end of the filter circuit 26 opposed to each other with the slot 27 being sandwiched therebetween, satisfy relationships of the formulas (i) to (iv) described with reference to FIG. 5.

Figure 10:
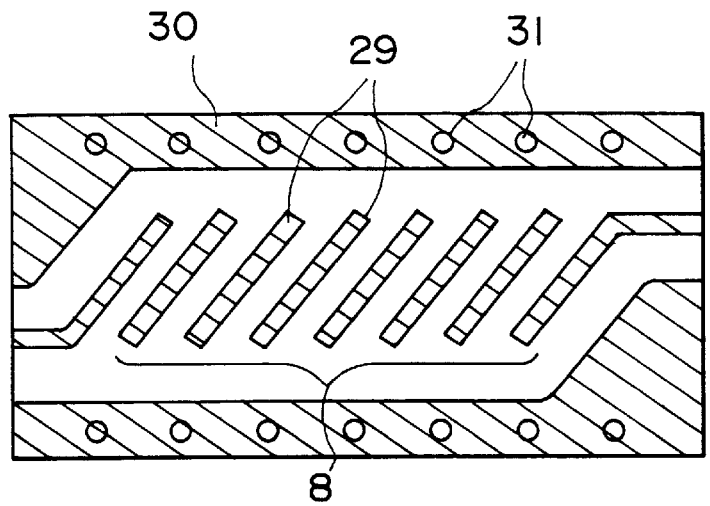
FIG. 10 is a diagram illustrating a planar structure of the filter circuit in the semiconductor device of FIG. 9.

Referring to FIG. 10 illustrating the planar structure of the filter circuit 26, the filter circuit 26 has a length corresponding to ½ the wavelength of the transmitted signals and is constituted by a plurality of conductors 29 formed on the same plane. Namely, the filter circuit 26 is constituted by plane-type strip resonance circuits arranged in many stages on the same plane. A ground belt 30 is formed to surround the strip resonance lines (filter circuit 26) to prevent the leakage of electromagnetic waves, and is electrically connected to the ground layers 23, 25 via the through-holes 31.

Figure 11:
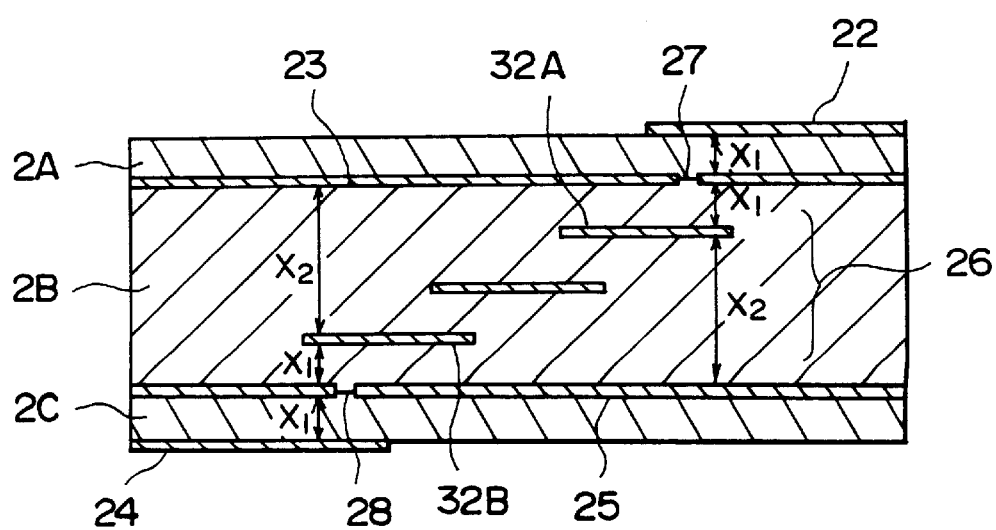
FIG. 11 is a diagram illustrating another example of the filter circuit.

The filter circuit 26 is not limited to the structure formed on the same plane shown in FIG. 10, but may have a plurality of conductors 32 formed on different planes as shown in, for example, FIG. 11. In FIG. 11, when the MS lines 20 and 21 are to be coupled together via the slots 27, 28 formed at positions corresponding to the ends of the conductors 32, it is desired that a gap X1 between the conductor 32A on the side of the MS line 20 and the ground layer 23 is smaller than a gap X2 between the conductor 32A and the ground layer 25. Compared to the case of FIG. 9 where the gaps X1 and X2 are the same, the electromagnetic coupling is accomplished more efficiently between the filter circuit 26 (conductor 32A) and the MS line 20, making it possible to enhance the transmission characteristics of the signals of a particular frequency. This also holds for a relationship between the conductor 32B located on the side of the MS line 21 and the ground layer 25.

According to the semiconductor devices of FIGS. 9 to 11, it is desired to form the dielectric layers 2A, 2C on which the MS lines 20, 21 are formed by using a dielectric having a low dielectric constant in order to improve transmission characteristics at high frequencies. In order to realize the filter circuit 26 in a small size, furthermore, it is desired that the dielectric constant of the dielectric layer 2B in which the filter circuit 26 is arranged, is selected to be larger than that of the dielectric layers 2A, 2C.

Described below is the structure in which the high-frequency semiconductor device of the invention is mounted on a mother board such as printed wiring board.

Figure 12:
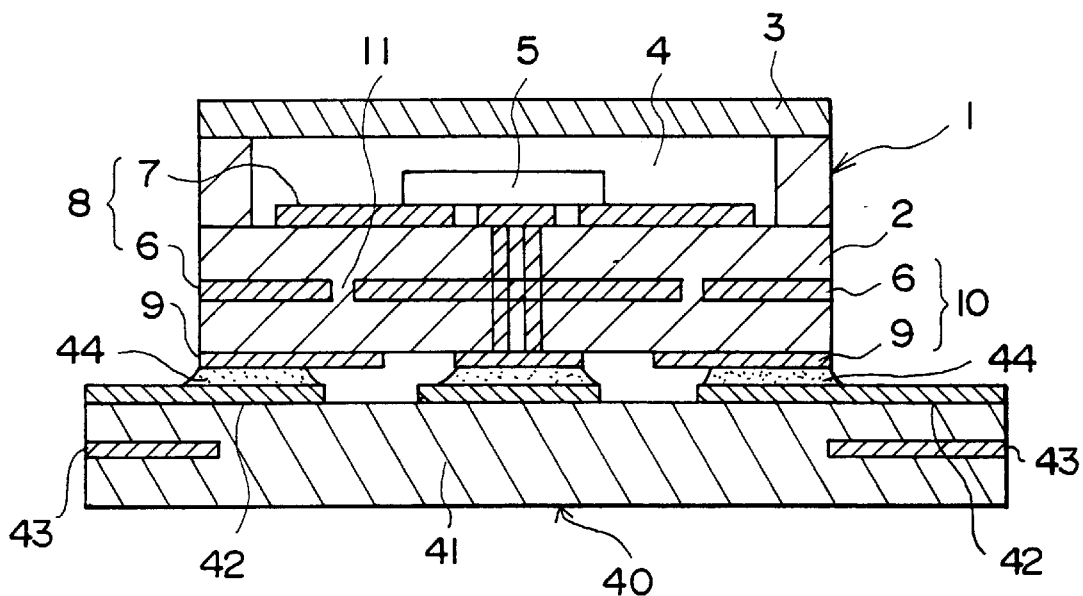
FIG. 12 is a diagram illustrating a structure of when the high-frequency semiconductor device of the present invention is mounted on a mother board.

Referring to FIG. 12 for explaining the mounted structure, a mother board 40 has, on at least the surface of an insulating board 41, a signal wiring layer 42 comprising high-frequency transmission lines such as microstrip line (MS line), coplanar waveguide, and conductor-backed coplanar waveguide. In the embodiment of FIG. 12, an MS line is employed as the signal wiring layer 42. That is, a ground layer 43 is formed inside the insulating board 41, and an MS line is constituted by the wiring layer 42 and the ground layer 43.

In the mounted structure of FIG. 12, the strip conductor 9 on the bottom surface of the device constituting a second MS line 10 in the high-frequency semiconductor device 1 is connected to a signal wiring layer 42 on the surface of the mother board 40 via a solder 44. The ground layer 18 and the power source layer 12 on the bottom surface of the semiconductor device 1 shown in FIG. 4 are connected by soldering to the ground wiring layer and the power source wiring layer (not shown) formed on the surface of the mother board 40.

Figure 13:
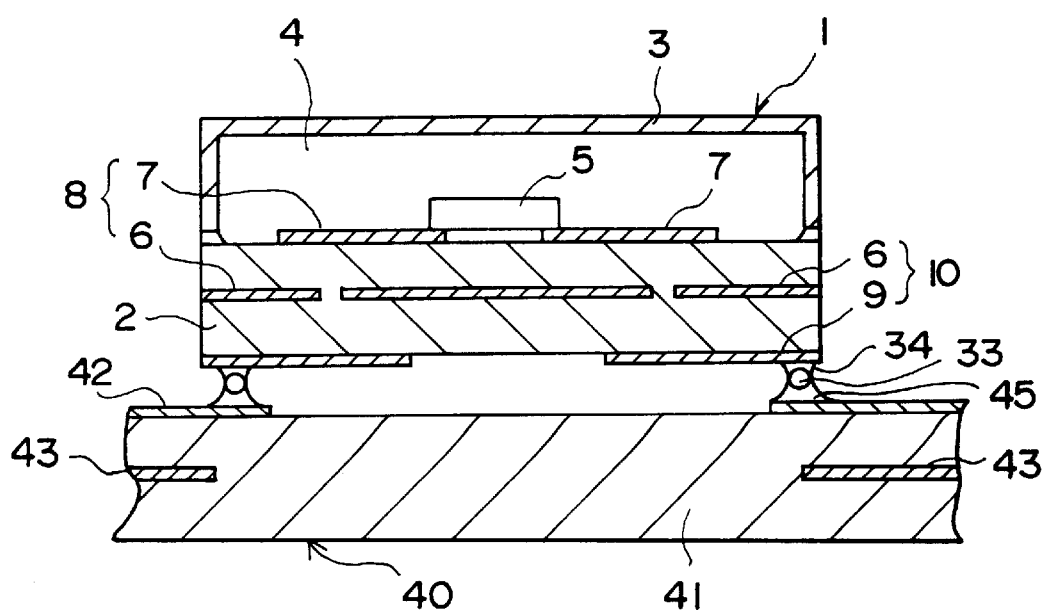
FIG. 13 is a diagram illustrating another structure for mounting the high-frequency semiconductor device of the present invention.

In the present invention, mounting the semiconductor device 1 is not limited to the embodiment of FIG. 12 only but can also be accomplished by any other method. Referring, for example, to FIG. 13 illustrating the mounted structure according to another embodiment, a connection terminal 33 of the shape of a ball is attached by a solder 34 to the end of the strip conductor 9, and is connected to the signal wiring layer 42 of the mother board 40 by a solder 45.

When the strip conductor 9 and the signal wiring layer 42 are to be connected together using an adhesive such as solder, it is difficult to form the solder in a predetermined shape since the solder is composed of materials different from the strip conductor 9 or the wiring layer 42, often resulting in the occurrence of mismatching of impedance. Consequently, reflection loss tends to occur in the solder-mounted portion, and the transmission of signals is often impaired. In such a case, the ground layer 18 and the power source layer 18 are secured to the mother board 40 by using a solder, etc., and the strip conductor 9 and the signal wiring layer 42 are contacted to each other by simply being placed one upon the other without using adhesive such as solder. Thus, the device is mounted without almost permitting reflection loss of the signals.

Figure 14:
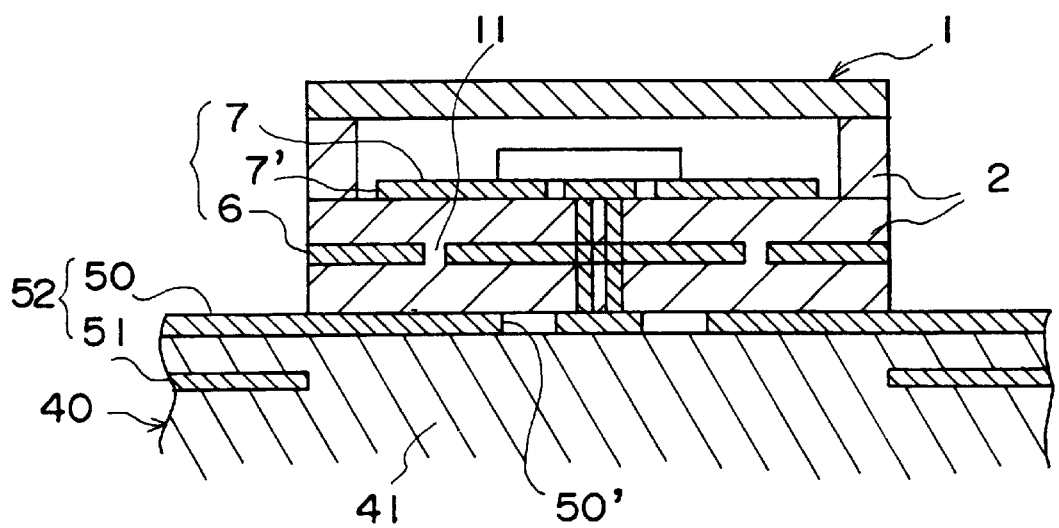
FIG. 14 is a diagram illustrating a further structure for mounting the high-frequency semiconductor device of the present invention.

Referring to FIG. 14 illustrating a further embodiment of the structure for mounting the semiconductor device 1, the conductor is not at all formed on the bottom surface of the dielectric board 2 of the high-frequency semiconductor device 1 but, instead, an MS line 52 that serves as a high-frequency transmission line is formed on the mother board 40. That is, the MS line 52 is constituted by a strip conductor 50 formed on the upper surface of the board 40 and a ground layer 51 inside the board 40, and works as the second MS line 10 in FIG. 1. Therefore, the end 50' of the strip conductor 50 and the end 7' of the strip conductor 7 in the semiconductor device 1 are opposed to each other with the slot 11 formed in the ground layer 6 being sandwiched therebetween, and the first MS line 8 in the semiconductor device 1 and the second MS line 52 formed on the mother board 40 are electromagnetically coupled together.

In the mounted structure of FIG. 14, too, it is desired that the strip conductor 7, strip conductor 50 and slot 11 satisfy relations of the above-mentioned formulas (i) to (iv).

In the high-frequency semiconductor device 1 of FIG. 14, the connection terminal 19 of ground layer 18 or the power layer 12 of semiconductor device 1 shown in FIG. 4, and the mother board 40 are connected together using an adhesive such as solder.

In the above-mentioned mounted structures shown in FIGS. 12 to 14, it is desired that the insulating board 41 of the mother board 40 has a dielectric constant of not larger than 7 from the standpoint of decreasing the transmission loss of signals in the semiconductor device 1. This is because, the dielectric constant must be low in order that the electric field is disturbed as little s possible in the electromagnetic coupling portion. hen the dielectric constant of the insulating board 41 is larger than 7, the electromagnetic field generated in the electromagnetic coupling portion changes due to the mother board 40 and the transmission characteristics are deteriorated.

It is therefore desired that the insulating board 41 is constituted by an insulating material comprising chiefly an organic resin such as epoxy resin, polyimide resin, fluorine-contained resin, phenol resin, bismaleimide triazine resin (BT resin) or polyphenylene ether (PPE). It is further desired that the wiring layer formed on the surface of the insulating board is composed of a low-resistance metal such as copper or the like.

EXAMPLES

Example 1

A glass ceramics (dielectric constant: 5.6) obtained by adding 40% by weight of cordierite (filler) to a crystalline borosilicate glass was used as a dielectric to prepare a green sheet, and a Cu paste was printed in a pattern to correspond to the microstrip line or the ground layer. The sheets were laminated one upon the other as a unitary structure, and were simultaneously fired in a nitrogen atmosphere at 940° C. to obtain a two-layer wiring board 60 for evaluation as shown in FIG. 15.

Figure 15:
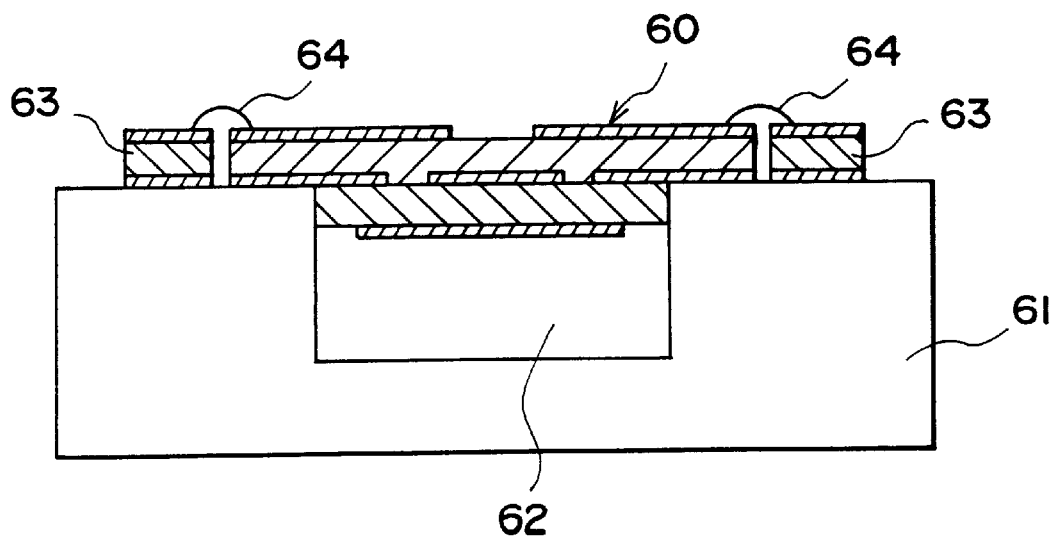
FIG. 15 is a diagram illustrating a state where a wiring board for evaluation prepared in Examples 1 and 2 is joined to a metal block used for measuring the transmission loss.
Figure 18:
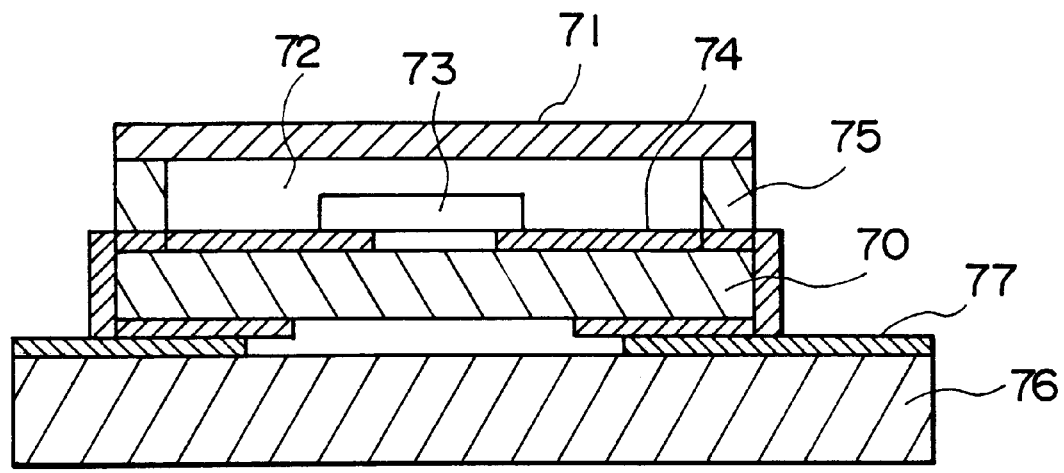
FIGS. 18 and 19 are diagrams illustrating structures of conventional known semiconductor devices.

FIG. 15 is a sectional view of when a metal block 61 is joined to the wiring board 60 for evaluation to measure the transmission loss. In FIG. 15, the wiring board 60 for evaluation was placed on the metal block 61 having a cavity 62 inside therein, and was electrically connected to conversion boards 63 for measurement through ribbons 64. The wiring board 60 for evaluation possessed two electromagnetic coupling portions for easy measurement, and was so arranged that the positions of connection to the conversion boards 63 for measurement were in flush.

The transmission loss measured in FIG. 15 was the sum of losses of two electromagnetic coupling portions, losses of two conversion boards for measurement, losses of two ribbons, losses of two ME lines connecting the ribbons to the electromagnetic coupling portions, and loss of one MS line connecting the electromagnetic coupling portion.

The wiring board 60 for evaluation possessed a size of 8.6 mm×8.6 mm, a thickness of 0.4 mm, the conductor layers possessed a thickness of 0.015 mm, the MS lines possessed a width of 0.3 mm, the distance from just over the center of slot in the MS line to the end of the line was ML (mm), the length of the slot was SL (mm), the width of the slot was SW (mm), and the insertion loss was measured at 60 GHz and 30 GHz. The results of measurements were as shown in Table 1 (60 GHz) and Table 2 (30 GHz).

The insertion losses shown in Tables 1 and 2 were values per one electromagnetic coupling, i.e., values obtained by subtracting losses other than those of the electromagnetic coupling portions from the insertion loss measured in FIG. 15, followed by the division by 2. Losses other than those of the electromagnetic coupling portions were measured by preparing a board having a single MS line and the same shape as the wiring board for evaluation but without including the electromagnetic coupling portion, and by measuring both ends of the MS line through ribbons.

TABLE 1

$\epsilon = 5.6, f = 60$ GHz

| Sample No. | ML (mm) | SL (mm) | SW (mm) | Insertion loss (dB) |
|---|---|---|---|---|
| *1 | 0.97 | 2.12 | 0.2 | −14.5 |
| *2 | 0.49 | 1.88 | 0.2 | −6.2 |
| 3 | 0.61 | 1.88 | 0.2 | −2.8 |
| 4 | 0.73 | 1.88 | 0.2 | −2.6 |
| 5 | 0.97 | 1.88 | 0.2 | −2.7 |
| 6 | 1.03 | 1.88 | 0.2 | −3.0 |
| *7 | 1.09 | 1.88 | 0.2 | −15.5 |
| 8 | 0.49 | 1.53 | 0.2 | −1.9 |
| 9 | 0.61 | 1.53 | 0.2 | −1.3 |
| 10 | 0.73 | 1.53 | 0.2 | −0.6 |
| 11 | 0.97 | 1.53 | 0.2 | −2.0 |
| 12 | 1.03 | 1.53 | 0.2 | −2.6 |
| *13 | 1.09 | 1.53 | 0.2 | −4.5 |
| *14 | 0.12 | 1.06 | 0.2 | −5.0 |
| 15 | 0.18 | 1.06 | 0.2 | −2.7 |
| 16 | 0.24 | 1.06 | 0.2 | −1.4 |
| 17 | 0.49 | 1.06 | 0.2 | −0.5 |
| 18 | 0.61 | 1.06 | 0.2 | −1.1 |
| *19 | 0.12 | 0.47 | 0.2 | −12.0 |
| 20 | 0.18 | 0.47 | 0.2 | −2.3 |
| 21 | 0.24 | 0.47 | 0.2 | −1.8 |
| 22 | 0.49 | 0.47 | 0.2 | −1.0 |
| *23 | 0.61 | 0.47 | 0.2 | −4.3 |
| *24 | 0.24 | 0.24 | 0.2 | −13.2 |
| 25 | 0.49 | 6.82 | 0.05 | −0.8 |
| 26 | 0.49 | 0.82 | 0.1 | −0.6 |
| 27 | 0.49 | 0.82 | 0.4 | −0.6 |
| *28 | 0.49 | 0.82 | 0.6 | −6.7 |

Samples marked with * are those which fail to satisfy the conditions of the formulas (i) to (iv) defined by the invention.

TABLE 2

$\epsilon = 5.6, f = 30$ GHz

| Sample No. | ML (Mm) | SL (mm) | SW (mm) | Insertion loss (dB) |
|---|---|---|---|---|
| *29 | 1.94 | 4.24 | 0.2 | −12.1 |
| *30 | 0.97 | 3.76 | 0.2 | −5.9 |
| 31 | 1.21 | 3.76 | 0.2 | −2.0 |
| 32 | 1.46 | 3.76 | 0.2 | −1.8 |
| 33 | 1.94 | 3.76 | 0.2 | −1.8 |
| 34 | 2.06 | 3.76 | 0.2 | −2.1 |
| *35 | 2.19 | 3.76 | 0.2 | −8.9 |
| 36 | 0.97 | 3.06 | 0.2 | −1.2 |
| 37 | 1.21 | 3.06 | 0.2 | −0.7 |
| 38 | 1.46 | 3.06 | 0.2 | −0.4 |
| 39 | 1.94 | 3.06 | 0.2 | −1.0 |
| 40 | 2.06 | 3.06 | 0.2 | −1.5 |
| *41 | 2.19 | 3.06 | 0.2 | −4.1 |
| *42 | 0.24 | 2.12 | 0.2 | −4.3 |
| 43 | 0.36 | 2.12 | 0.2 | −1.6 |
| 44 | 0.49 | 2.12 | 0.2 | −0.9 |
| 45 | 0.97 | 2.12 | 0.2 | −0.3 |
| 46 | 1.21 | 2.12 | 0.2 | −0.7 |
| *47 | 0.24 | 0.94 | 0.2 | −11.6 |
| 48 | 0.36 | 0.94 | 0.2 | −1.9 |
| 49 | 0.49 | 0.94 | 0.2 | −1.0 |
| 50 | 0.97 | 0.94 | 0.2 | −0.7 |
| *51 | 1.21 | 0.94 | 0.2 | −4.1 |
| *52 | 0.49 | 0.49 | 0.2 | −12.6 |

Samples marked with * are those which fail to satisfy the conditions of the formulas (i) to (iv) defined by the invention.

It will be understood from the results of Tables 1 and 2 that the coupling with an insertion loss of smaller than −4 dB is realized when the values ML, SL and SW satisfies the conditions expressed by the above-mentioned formulas. It will further be understood that the relationships do not change even when the frequency of the transmitted signals is changed from 30 GHz into 60 GHz.

Example 2

A wiring board for evaluation was prepared in the same manner as in Example 1 but using a dielectric ceramic material having a dielectric constant of as high as 20 obtained by adding magnesium titanate, calcium titanate and, as sintering assistants, boron oxide and lithium oxide, instead of using the glass ceramics having a low dielectric constant of Example 1, and the insertion loss was measured at a frequency of 60 GHz. The results were as shown in Table 3.

As a conductor, furthermore, use was made of tungsten instead of copper, a green sheet was prepared by using a ceramic material of a composition same as the above-mentioned dielectric ceramic material composition having a high dielectric constant but from which the sintering assistants were removed, followed by simultaneous firing in a humid reducing atmosphere (10% of hydrogen, 90% of nitrogen, dew point of 20° C.) at 1500° C., to measure the insertion loss in the same manner as described above. Table 3 also shows the results.

TABLE 3

$\epsilon = 20.0, f = 60$ GHz

| Sample No. | ML (mm) | SL (mm) | SW (mm) | Insertion loss (dB) |
|---|---|---|---|---|
| *53 | 0.13 | 0.87 | 0.2 | −10.0 |
| 54 | 0.26 | 0.87 | 0.2 | −1.1 |
| 55 | 0.39 | 0.87 | 0.2 | −0.4 |

TABLE 3-continued $\epsilon = 20.0, f = 60$ GHz

| Sample No. | ML (mm) | SL (mm) | SW (mm) | Insertion loss (dB) |
|---|---|---|---|---|
| 56 | 0.51 | 0.87 | 0.2 | −1.5 |
| 57 | 0.13 | 0.62 | 0.2 | −2.5 |
| 58 | 0.26 | 0.62 | 0.2 | −2.3 |
| 59 | 0.39 | 0.62 | 0.2 | −0.6 |
| *60 | 0.51 | 0.62 | 0.2 | −7.7 |
| 61 | 0.13 | 0.37 | 0.2 | −2.4 |
| 62 | 0.26 | 0.37 | 0.2 | −1.0 |
| *63 | 0.39 | 0.37 | 0.2 | −5.5 |
| *64 | 0.51 | 0.37 | 0.2 | −13.8 |
| 65 | 0.39 | 0.62 | 0.2 | −0.9 |

Samples marked with * are those which fail to satisfy the conditions of the formulas (i) to (iv) defined by the invention.
Sample No. 65 has used tungsten as a conductor.

It will be understood from the results of Table 3 that the coupling with an insertion loss of smaller than −4 dB is realized when the values ML, SL and SW satisfy the conditions represented by the above-mentioned formulas. It will further be understood from the comparison with the results of Tables 1 and 2 that the relationships do not change even when the dielectric exhibits an increased dielectric constant.

Comparison of the sample No. 59 with the sample No. 65 indicates that the insertion loss is small even when tungsten is used as a conductor but further decreases when use is made of copper having a smaller electric resistance.

Example 3

The semiconductor devices of the structure shown FIGS. 1 to 4 were prepared by using three kinds of dielectric boards made of the following glass ceramics, i.e., ① the one having a dielectric constant of 3.9 and a dielectric loss of $4.0 \times 10^{-4}$ (measured at a frequency of 15 GHz), ② the one having a dielectric constant of 5.6 and a dielectric loss of $14.0 \times 10^{-4}$ (measured at a frequency of 12 GHz), or ③ the one having a dielectric constant of 9.5 and a dielectric loss of $1.5 \times 10^{-3}$ (measured at a frequency of 9 GHz), and by using copper as a conductor.

The semiconductor devices were mounted on the circuit boards of Duroid (RT/5880) having a dielectric constant of 2.2 (at a frequency of 10 GHz). The transmission characteristics at the input portions were measured by a network analyzer. The results were as shown in FIG. 16. The semiconductor devices were mounted by connecting the power layers and the ground layers by soldering, and by connecting the strip conductors (signal transmission lines) by simply placing them on the circuit board without using an adhesive such as solder. It will be understood from the results of FIG. 16 that the signals are transmitted with the least loss when the dielectric board of the semiconductor device has a dielectric constant of 9.5, and the loss increases when the dielectric constants are 3.9 and 5.6.

Example 4

The semiconductor devices having a dielectric board composed of a glass ceramics having a dielectric constant of 9.5 were mounted ① on a circuit board having a dielectric constant of 2.2 and a dielectric loss of $9.0 \times 10^{-4}$ (measured at 10 GHz), ② on a circuit board having a dielectric constant of 5.6 and a dielectric loss of $1.4 \times 10^{-3}$ (measured at 12 GHz), or ③ on a circuit board having a dielectric constant of 9.5 and a dielectric loss of $1.5 \times 10^{-3}$ (measured at 9 GHz). The S11 transmission characteristics at the input portions were measured by using a network analyzer. The results were as shown in FIG. 17. It will be obvious from FIG. 17 that good characteristics are exhibited with a decrease in the dielectric constant of the circuit board, and excellent characteristics are exhibited particularly when use is made of a circuit board having a dielectric constant of not larger than 7.

Comparative Example 1

Figure 19:
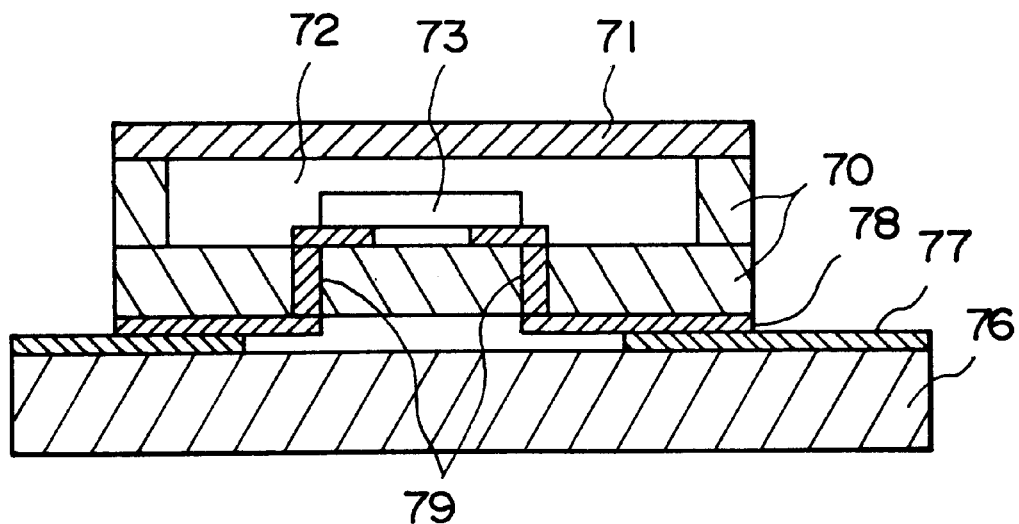

A semiconductor device of a conventional structure shown in FIG. 19 was measured in the same manner as described above by using the network analyzer, the semiconductor device having a dielectric material of a dielectric constant of 8.8 and a dielectric loss of $55.0 \times 10^{-4}$ (measured at a frequency of 60 GHz) and a transmission line formed on the bottom surface which were connected together using via-holes of a diameter of 200 μm and were composed of copper. The results were as shown in FIG. 20. When the transmission lines are connected using via-holes, it is obvious from the results of FIG. 20 that S11 is greater than −10 dB and S21 is smaller than −30 dB when the frequency is not lower than 20 GHz. It is thus obvious that the high-frequency signals are not transmitted to the semiconductor device.

We claim:

1. A high-frequency semiconductor device containing a semiconductor element in a cavity formed by a dielectric board and a cap, comprising a first high-frequency transmission line formed on a surface of said dielectric board in said cavity and connected to said semiconductor element, and a second high-frequency transmission line formed on a bottom surface of said dielectric board, said first high-frequency transmission line and said second high-frequency transmission line being electromagnetically coupled together.

2. A high-frequency semiconductor device according to claim 1, wherein a ground layer having a slot is provided in said dielectric board, and an end of said first high-frequency transmission line and an end of said second high-frequency transmission line are opposed to each other with said slot being sandwiched therebetween thereby to electromagnetically couple said first and second high-frequency transmission lines together.

3. A high-frequency semiconductor device according to claim 2, wherein said first and second high-frequency transmission lines are both constituted by microstrip lines and, when, the frequency of high-frequency signals transmitting through said lines is denoted by f(GHz), the dielectric constant of said dielectric board is denoted by ε, the distance from a portion corresponding to the center of a slot of said first and second high-frequency transmission lines to the ends of these transmission lines by ML (mm), the long-side diameter of the slot by SL (mm) and the width of the slot by SW (mm), the following formulas:

$$\frac{21.6}{f \cdot \varepsilon^{1/2}} \leq ML \leq \frac{151}{f \cdot \varepsilon^{1/2}}$$

$$\frac{50.1}{f \cdot \varepsilon^{1/2}} \leq SL \leq \frac{284}{f \cdot \varepsilon^{1/2}}$$

$$2.04 \cdot ML - \frac{91.0}{f \cdot \varepsilon^{1/2}} \leq SL \leq 2.07 / ML + \frac{106}{f \cdot \varepsilon^{1/2}}$$

$$0.05 \leq SW \leq 0.4$$

are satisfied.

4. A high-frequency semiconductor device containing a semiconductor element in a cavity formed by a dielectric board and a cap, comprising:

a first high-frequency transmission line formed on a surface of said dielectric board in said cavity and connected to said semiconductor element; and a second high-frequency transmission line formed on a bottom surface of said dielectric board, said first high-frequency transmission line and said second high-frequency transmission line being electromagnetically coupled together, wherein a ground layer having a slot is provided in said dielectric board, and an end of said first high-frequency transmission line and an end of said second high-frequency transmission line are opposed to each other with said slot being sandwiched therebetween thereby to electromagnetically couple said first and second high-frequency transmission lines together, wherein said first and second high-frequency transmission lines are both constituted by microstrip lines and, when, the frequency of high-frequency signals transmitting through said lines is denoted by f(GHz), the dielectric constant of said dielectric board is denoted by $\epsilon$, the distance from a portion corresponding to the center of a slot of said first and second high-frequency transmission lines to the ends of these transmission lines by ML (mm), the long-side diameter of the slot by SL (mm) and the width of the slot by SW (mm), the following formulas:

$$\frac{21.6}{f \cdot \varepsilon^{1/2}} \leq ML \leq \frac{151}{f \cdot \varepsilon^{1/2}}$$

$$\frac{50.1}{f \cdot \varepsilon^{1/2}} \leq SL \leq \frac{284}{f \cdot \varepsilon^{1/2}}$$

$$2.04 \cdot ML - \frac{91.0}{f \cdot \varepsilon^{1/2}} \leq SL \leq 2.07 / ML + \frac{106}{f \cdot \varepsilon^{1/2}}$$

$$0.05 \leq SW \leq 0.4$$

are satisfied.

5. A high-frequency semiconductor device containing a semiconductor element in a cavity formed by a dielectric board and a cap, comprising:

a first high-frequency transmission line formed on a surface of said dielectric board in said cavity and connected to said semiconductor element; and a second high-frequency transmission line formed on a bottom surface of said dielectric board, said first high-frequency transmission line and said second high-frequency transmission line being electromagnetically coupled together, wherein the second high frequency transmission line in the high-frequency semiconductor device is directly connected by soldering to a wiring layer formed on the surface of a mother board.

6. A high-frequency semiconductor device according to claim 5, wherein said dielectric board has a dielectric constant which is not smaller than 7.

7. A high-frequency semiconductor device according to claim 5, wherein a filter circuit is provided between the first high-frequency transmission line and the second high-frequency transmission line.

8. A structure for mounting a high-frequency semiconductor device according to claim 5, wherein the dielectric board of said semiconductor device has a dielectric constant of not smaller than 7, and the insulating board for forming said mother board has a dielectric constant of not larger than 7.

9. A structure for mounting a high-frequency semiconductor device of claim 5, wherein a connection terminal is provided for the second high-frequency transmission line in the high-frequency semiconductor device, and the wiring layer formed on the surface of a mother board is connected via said connection terminal.

10. A high-frequency semiconductor device containing a semiconductor element in a cavity formed by a dielectric board and a cap, comprising:

a first high-frequency transmission line formed on a surface of said dielectric board in said cavity and connected to said semiconductor element; and a second high-frequency transmission line formed on a bottom surface of said dielectric board. said first high-frequency transmission line and said second high-frequency transmission line being electromagnetically coupled together, wherein a connection terminal is provided for the second high-frequency transmission line in the high-frequency semiconductor device, and the wiring layer formed on the surface of a mother board is connected via said connection terminal.

11. A structure for mounting a high-frequency semiconductor device according to claim 9, wherein said dielectric board has a dielectric constant which is not smaller than 7, and the insulating board used for forming said mother board has a dielectric constant which is not larger than 7.

12. A structure for mounting a high-frequency semiconductor device according to claim 10, wherein the dielectric board of said semiconductor device has a dielectric constant of not smaller than 7, and the insulating board for forming said mother board has a dielectric constant of not larger than 7.

13. A structure for mounting, on a mother board, a high-frequency semiconductor device containing a semiconductor element in a cavity formed by a dielectric board and a cap, wherein a first high-frequency transmission line connected to said semiconductor element is formed on a surface of said dielectric board in said cavity of said semiconductor device, a second high-frequency transmission line is formed on a surface of said mother board, and said first high-frequency transmission line and said second high-frequency transmission line are electromagnetically coupled together, wherein the second high frequency transmission line in the high-frequency semiconductor device is directly connected by soldering to a wiring layer formed on the surface of a mother board.

14. A structure for mounting a high-frequency semiconductor device according to claim 13, wherein a ground layer having a slot is provided in said dielectric board of said semiconductor device, and an end of said first high-frequency transmission line and an end of said second high-frequency transmission line are opposed to each other with said slot being sandwiched therebetween thereby to electromagnetically couple said first and second high-frequency transmission lines together.

15. A structure for mounting a high-frequency semiconductor device according to claim 13, wherein said first and second high-frequency transmission lines are both constituted by microstrip lines and, when, the frequency of high-frequency signals transmitting through said lines is denoted by f(GHz), the dielectric constant of said dielectric board is denoted by $\epsilon$, the distance from a portion corresponding to the center of a slot of said first and second high-frequency transmission lines to the ends of these transmission lines by ML (mm), the long-side diameter of the slot by SL (mm) and the width of the slot by SW (mm), the following formulas:

$$\frac{21.6}{f \cdot \varepsilon^{1/2}} \leq ML \leq \frac{151}{f \cdot \varepsilon^{1/2}}$$

$$\frac{50.1}{f \cdot \varepsilon^{1/2}} \leq SL \leq \frac{284}{f \cdot \varepsilon^{1/2}}$$

$$2.04 \cdot ML - \frac{91.0}{f \cdot \varepsilon^{1/2}} \leq SL \leq 2.07/ML + \frac{106}{f \cdot \varepsilon^{1/2}}$$

$$0.05 \leq SW \leq 0.4$$

are satisfied.

16. A structure for mounting, on a mother board, a high-frequency semiconductor device containing a semiconductor element in a cavity formed by a dielectric board and a cap, wherein a first high-frequency transmission line connected to said semiconductor element is formed on a surface of said dielectric board in said cavity of said semiconductor device, a second high-frequency transmission line is formed on a surface of said mother board, and said first high-frequency transmission line and said second high-frequency transmission line are electromagnetically coupled together, wherein said first and second high-frequency transmission lines are both constituted by microstrip lines and, when, the frequency of high-frequency signals transmitting through said lines is denoted by f(GHz), the dielectric constant of said dielectric board is denoted by $\epsilon$, the distance from a portion corresponding to the center of a slot of said first and second high-frequency transmission lines to the ends of these transmission lines by ML (mm), the long-side diameter of the slot by SL (mm) and the width of the slot by SW (mm), the following formulas:

$$\frac{21.6}{f \cdot \varepsilon^{1/2}} \leq ML \leq \frac{151}{f \cdot \varepsilon^{1/2}}$$

$$\frac{50.1}{f \cdot \varepsilon^{1/2}} \leq SL \leq \frac{284}{f \cdot \varepsilon^{1/2}}$$

$$2.04 \cdot ML - \frac{91.0}{f \cdot \varepsilon^{1/2}} \leq SL \leq 2.07/ML + \frac{106}{f \cdot \varepsilon^{1/2}}$$

$$0.05 \leq SW \leq 0.4$$

are satisfied.

* * * * *